United States Patent
Messier et al.

(10) Patent No.: US 11,187,745 B2
(45) Date of Patent: Nov. 30, 2021

(54) STABILIZING A VOLTAGE AT A DEVICE UNDER TEST

(71) Applicant: Teradyne, Inc., North Reading, MA (US)

(72) Inventors: Jason A. Messier, Winchester, MA (US); Bryce M. Wynn, Cambridge, MA (US); Anja Deric, Mendon, MA (US)

(73) Assignee: TERADYNE, INC., North Reading, MA (US)

( * ) Notice: Subject to any disclaimer, the term of this patent is extended or adjusted under 35 U.S.C. 154(b) by 239 days.

(21) Appl. No.: 16/669,092

(22) Filed: Oct. 30, 2019

(65) Prior Publication Data

US 2021/0132143 A1 May 6, 2021

(51) Int. Cl.
*G01R 31/28* (2006.01)
(52) U.S. Cl.
CPC .............................. *G01R 31/2879* (2013.01)
(58) Field of Classification Search
CPC .................. G01R 33/0017; G01R 33/0035
See application file for complete search history.

(56) References Cited

U.S. PATENT DOCUMENTS

| | | | |
|---|---|---|---|
| 4,268,790 A | 5/1981 | Nercessian | |
| 4,325,113 A | 4/1982 | Tomlie, Jr. | |
| 6,124,703 A | 9/2000 | Krause et al. | |
| 6,396,298 B1 | 5/2002 | Young et al. | |
| 6,933,772 B1 | 8/2005 | Banerjee | |
| 7,327,816 B2 | 2/2008 | Messier | |
| 7,336,748 B2 | 2/2008 | Messier | |
| 7,523,238 B2 | 4/2009 | Messier | |
| 8,144,040 B2 | 3/2012 | Messier et al. | |
| 8,193,956 B2 | 6/2012 | Messier | |
| 8,952,634 B2 | 2/2015 | Sliski et al. | |
| 9,235,196 B2 | 1/2016 | Watanabe et al. | |
| 2005/0135524 A1 | 6/2005 | Messier | |
| 2005/0135525 A1 | 6/2005 | Messier | |

(Continued)

FOREIGN PATENT DOCUMENTS

| | | |
|---|---|---|
| WO | 2018177536 A1 | 10/2018 |
| WO | 2019054059 A1 | 3/2019 |

OTHER PUBLICATIONS

International Search Report for International Application No. PCT/US2020/050117, (dated Dec. 22, 2020), 4 pages.

(Continued)

*Primary Examiner* — Tung X Nguyen
(74) *Attorney, Agent, or Firm* — Burns & Levinson LLP

(57) ABSTRACT

An example method of stabilizing a voltage at a device under test (DUT) includes identifying one or more characteristics of a deviation in a first voltage to appear at the DUT. The deviation may result from a digital signal and a concomitant transient current in the DUT. The digital signal may be part of a test flow to be sent over one or more test channels of automatic test equipment (ATE) to the DUT. The one or more characteristics may be identified prior to sending the test flow to the DUT. The method also includes generating a second voltage to apply to the DUT. The second voltage may be based on the one or more characteristics and being shaped to reduce the deviation.

23 Claims, 3 Drawing Sheets

(56) References Cited

U.S. PATENT DOCUMENTS

| | | |
|---|---|---|
| 2006/0279310 A1* | 12/2006 | Walker .................. G11C 29/56 |
| | | 324/762.01 |
| 2007/0005282 A1 | 1/2007 | Messier |
| 2009/0168575 A1 | 7/2009 | Messier |
| 2011/0001644 A1 | 1/2011 | Messier |
| 2011/0001645 A1 | 1/2011 | Messier et al. |
| 2011/0095798 A1* | 4/2011 | Torres .............. G01R 31/31928 |
| | | 327/178 |
| 2013/0229197 A1* | 9/2013 | Kusaka .............. G01R 31/2832 |
| | | 324/750.01 |
| 2019/0140032 A1 | 5/2019 | Messier et al. |

OTHER PUBLICATIONS

Written Opinion for International Application No. PCT/US2020/050117, (dated Dec. 22, 2020), 7 pages.

* cited by examiner

STABILIZING A VOLTAGE AT A DEVICE UNDER TEST

TECHNICAL FIELD

This specification describes examples of test systems configured to stabilize a voltage at a device under test.

BACKGROUND

Test systems are configured to test the operation of electronic devices, such as microprocessors and memory chips. Testing may include sending signals to a device and determining how the device reacted to those signals based on its response. For example, testing may include forcing voltage and current onto a test channel and receiving signals from the device based on the forced voltage and current. The device's reaction will dictate whether the device has passed or failed testing. A voltage source may be used to power a device under test.

SUMMARY

An example method for stabilizing a voltage at a device under test (DUT) includes identifying one or more characteristics of a deviation in a first voltage to appear at the DUT. The deviation may result from a digital signal and a concomitant transient current in the DUT. The digital signal may be part of a test flow that is to be sent over one or more test channels of automatic test equipment (ATE) to the DUT. The one or more characteristics may be identified prior to sending the test flow to the DUT. The method also includes generating a second voltage to apply to the DUT. The second voltage may be based on the one or more characteristics and may be shaped to reduce the deviation. The example method may include one or more of the following features, taken alone or in combination.

The transient current may be caused by a change in state of the DUT caused by the digital signal. The deviation may include either (i) a temporary drop in the voltage followed by a temporary rise in the voltage, or (ii) a temporary rise in the voltage followed by a temporary drop in the voltage. The one or more characteristics may be based on either (i) a magnitude of the temporary drop in the voltage and a magnitude of the temporary rise in the voltage, or (ii) a magnitude of the temporary rise in the voltage and a magnitude of the temporary drop in the voltage. The one or more characteristics may include a duration between the digital signal and the deviation in the voltage.

Generating the second voltage may include changing a test program that also produces the test flow. The method may include iterating two or more times through the identifying and generating operations in order to reduce the deviation further during each iteration. The test flow may implement scan testing. The method may include sensing the first voltage at the DUT through a voltage sensor. Identifying the one or more characteristics may be based on the sensed voltage. The method may include performing a calibration operation to determine the second voltage. The second voltage being may be based on an unspecified load between a voltage source and the DUT.

An example test system includes a voltage source to provide voltage to a DUT and a test instrument to send a test flow to the DUT over one or more test channels. The test system also includes one or more processing devices to identify one or more characteristics of a deviation in a first voltage to appear at the DUT, where the first voltage is to be based on the voltage from the voltage source, where the deviation is to result from a digital signal and a concomitant transient current in the DUT, where the digital signal is part of the test flow, and where the one or more characteristics are identified prior to sending the test flow to the DUT. The one or more processing devices are also configured to control the voltage source to output a second voltage. The second voltage may be based on the one or more characteristics and may be shaped to reduce the deviation. The example test system may include one or more of the following features, taken alone or in combination.

The transient current may be caused by a change in state of the DUT caused by the digital signal. The deviation may include either (i) a temporary drop in the voltage followed by a temporary rise in the voltage, or (ii) a temporary rise in the voltage followed by a temporary drop in the voltage. The one or more characteristics may be based on either (i) a magnitude of the temporary drop in the voltage and a magnitude of the temporary rise in the voltage, or (ii) a magnitude of the temporary rise in the voltage and a magnitude of the temporary drop in the voltage. The one or more characteristics may include a duration between the digital signal and the deviation in the voltage. The voltage source may be controlled by a test program that also produces the test flow.

The one or more processing devices may be configured to control operations that include iterating two or more times through the identifying and controlling operations in order to reduce the deviation further during each iteration. The test flow may implement scan testing. The test system may include a voltage sensor to sense the voltage at the DUT. The voltage sensor may be part of the voltage source or may be separate from the voltage source. Identifying the one or more characteristics may be based on the sensed voltage obtained from the voltage sensor.

The test system may include a device interface board (DIB) for connecting the test instrument to the DUT. The DIB may include a site to which the DUT connects. The one or more characteristics of the deviation may be based on at least one of inductance or capacitance on one or more conductors or components contained in the DIB. The test system may include one or more sense lines between the voltage source and the DUT. The one or more sense lines may be configured to sense at least voltage proximate to the DUT. The one or more processing devices may be configured to perform a calibration operation to determine the second voltage. The second voltage may be based on an unspecified load between the voltage source and the DUT.

Any two or more of the features described in this specification, including in this summary section, may be combined to form implementations not specifically described in this specification.

At least part of the test systems and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the test systems and processes described in this specification may be configured or controlled using a computing system comprised of one or more processing devices and memory storing instructions that are executable by the one or more processing devices to perform various control operations.

The details of one or more implementations are set forth in the accompanying drawings and the following descrip-

DESCRIPTION OF THE DRAWINGS

Like reference numerals in different figures indicate like elements.

DETAILED DESCRIPTION

Described herein are example implementations of a system that is configured to supply voltage to a device under test (DUT) in a test system, such as automatic test equipment (ATE). The system includes a voltage source, such as a digital power supply (DPS) or other appropriate voltage generator. The voltage source is configured and controlled to enable a feed-forward approach to addressing voltage deviations that appear at the DUT when the DUT changes state, such as when the DUT is initially powered-on to test. The feed-forward approach includes identifying one or more characteristics of the voltage at the DUT in response to receipt of a digital signal, such as a digital burst that is part of a test flow to test the DUT. The one or more characteristics may include any deviation in the voltage from its expected value at the DUT. For example, the one or more characteristics may include a temporary drop in the voltage followed by a temporary rise in the voltage or a temporary rise in the voltage followed by a temporary drop in the voltage.

The voltage deviation is a result of a reaction of the DUT to the digital signal and a concomitant transient current produced in the DUT. The one or more characteristics (referred to herein as "characteristics") of the deviation are known prior to testing the DUT—for example, they are known prior to sending a test flow that includes the digital signal to the DUT. In some implementations the characteristics are determined based on pre-testing calibration operations, known reactions of the DUT to known digital signals, or a combination of these and other factors. Consequently, in some implementations, feedback or ongoing feedback is not used to generate data that is used to reduce the deviation.

A control system comprised, for example, of hardware, software, or a combination of hardware and software, is configured to control the voltage output to the DUT based on characteristics of the voltage at the DUT. In some implementations, the characteristics include a duration between the digital signal and the deviation in the voltage. Based on this duration and the features of the deviation such as the magnitude and shape of the drop and rise, the control system controls the voltage source to produce an output voltage that is shaped to reduce the voltage deviation at the DUT.

Figure 1:
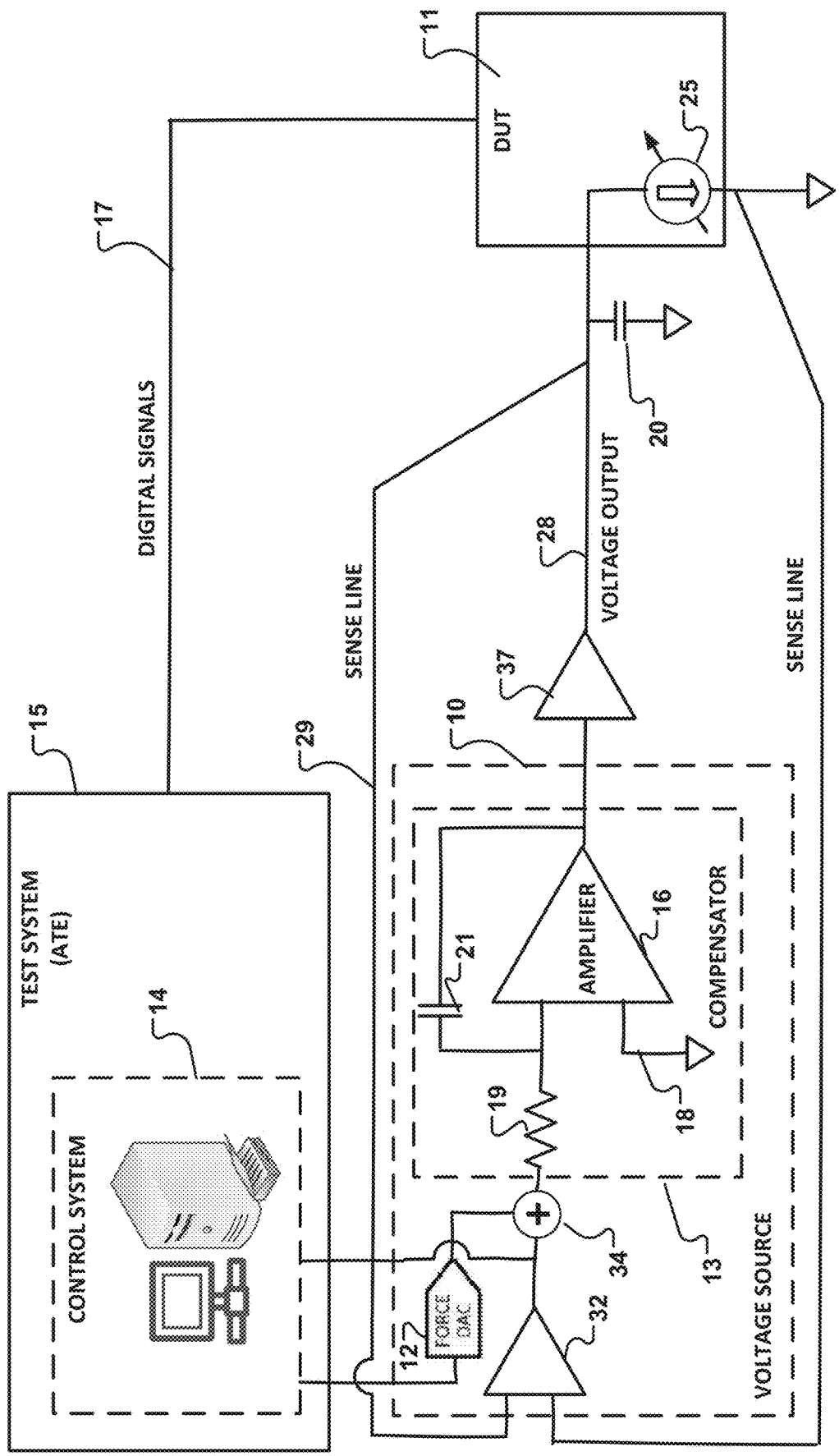
FIG. 1 is a diagram of components of an example test system including a controllable voltage supply.

FIG. 1 is a diagram showing an example implementation of a voltage source 10, including compensator 13, for supplying power to a DUT 11 over one or more conduits. In this example, voltage source 10 includes a force digital-to-analog converter (DAC) 12 to generate a voltage signal. The force DAC is responsive to digital commands from a control system 14, which may include a computing system comprised of one or more processing devices as described herein. The control system is part of a test system 15, an example of which is described below. The signal generated by the force DAC is changeable to control the voltage output of the voltage source to reduce the deviation in voltage that occurs at the DUT in response to a digital signal from the test system. For example, comparator 32 determines the difference in voltage on the sense lines and outputs that difference to combinatorial logic 34, which may be an adder or subtractor for example. The signal generated by the force DAC, such as a voltage signal, is used to control the voltage output of combinatorial logic 34. For example, the signal generated by the force DAC may be the sole signal used to produce the voltage output of combinatorial logic 34. In this case, the voltage output to the DUT may be based solely or primarily on the voltage signal produced by the force DAC. In another example, the signal generated by the force DAC may be used to adjust the voltage difference on the sense lines. In this case the voltage output of combinatorial logic 34, and thus the voltage provided to the DUT that is output by the voltage source, is based on the signal generated by the force DAC and the voltage difference on the sense lines.

Voltage source 10 may also include a voltage amplifier 16, such as an operational amplifier ("op-amp") to provide a voltage to the DUT that is based on the voltage signal from the force DAC and a reference voltage 18, such as electrical ground, applied to another input of the amplifier. Resistor 19 and capacitor 21 form an op-amp integrator circuit, in which the output responds to changes in the input voltage over time as the op-amp integrator produces an output voltage which is proportional to the integral of the input voltage. By controlling the input from the force DAC based on characteristics of the voltage at the DUT, the deviation from the intended voltage at the DUT can be eliminated or reduced. For example, the control system may provide commands to the force DAC to shape the voltage output produced by the amplifier to reduce or to eliminate the deviation from an intended voltage at the DUT. In this manner, the test system can stabilize the voltage at the DUT.

By way of example, the voltage output from voltage source 10 may be shaped to reduce, at the DUT, voltage deviations such as a magnitude of a voltage drop, a magnitude of a voltage rise, or both the magnitude of the voltage drop and the magnitude of the voltage rise. The voltage output from voltage source 10 may be timed so that the adjustments to the voltage to address deviations in voltage at the DUT reach the DUT at the appropriate time taking into account the type conduits used to deliver the voltage and the characteristics of those conduits. The characteristics of the conduits may be based, at least in part, on the distance between the voltage source and the DUT. A driver or amplifier 37 may be included along the voltage output line.

One or more capacitors 20 may be included proximate to the DUT to reduce the voltage deviations that are produced when a digital signal 17 is received at the DUT from the test system. The size, the presence, or the absence of capacitors proximate to the DUT will affect how the output from the voltage source is shaped to reduce the voltage deviation at the DUT. In this regard, the characteristics may also be based on inductance, capacitance, and/or resistance on one or more conductors or components used to deliver voltage to the DUT. These inductances, capacitances, and/or resistances will also affect how the output from the voltage source is shaped to reduce the voltage deviation at the DUT. As described below, one or more of these conductors or components may be part of the test system's device interface board (DIB).

Figure 2:
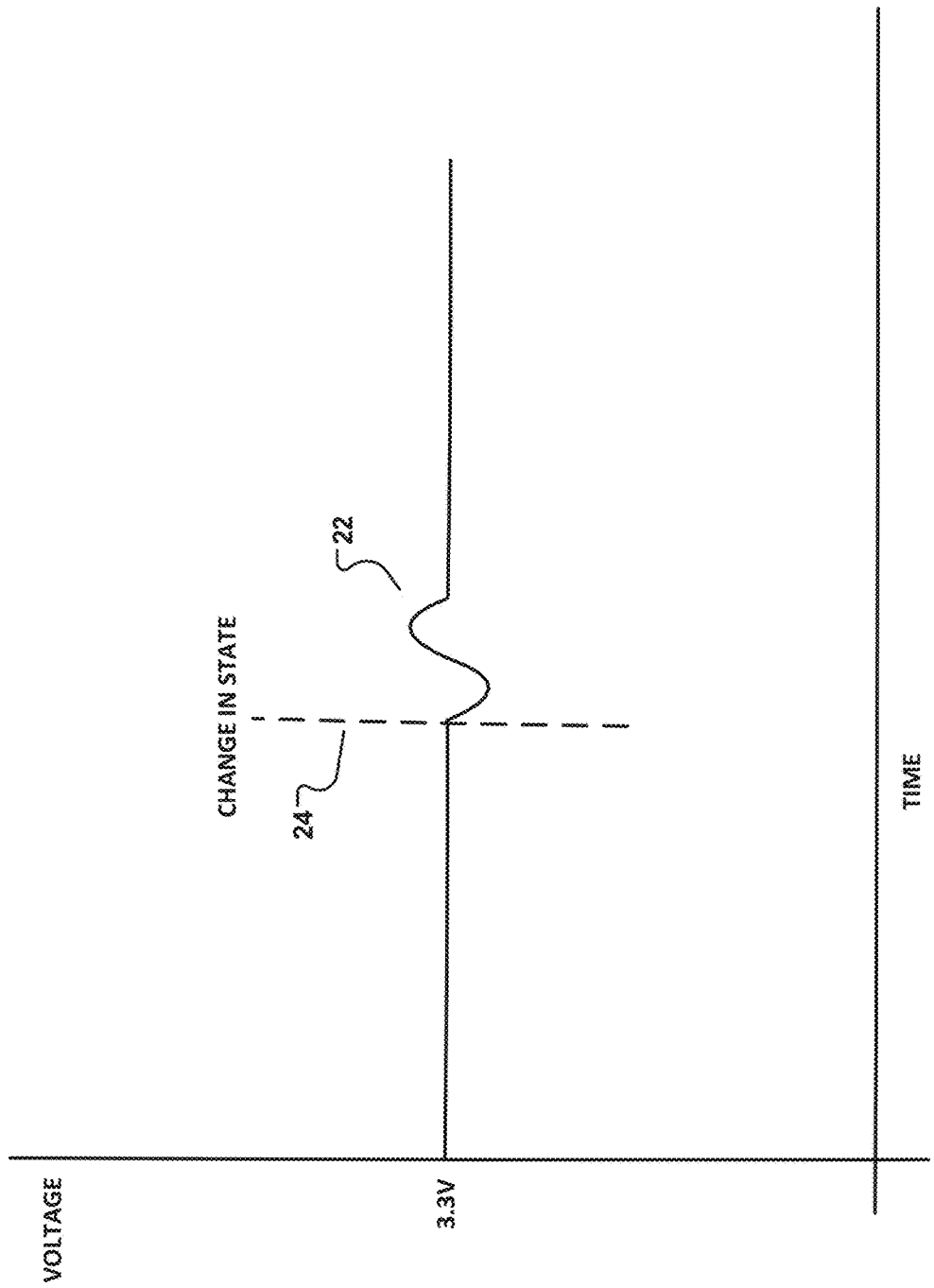
FIG. 2 is a graph of an example voltage transient at the DUT.

Referring to FIG. 2 for example, the voltage output from voltage source 10 may be 3.3 volts (V). That may be the intended voltage at the DUT. However, a digital signal, such as a digital burst, may cause a deviation 22 in voltage at the DUT. The deviation may be caused by transient current in the DUT resulting from the digital signal. In some examples, this deviation in voltage only occurs, for example, during or in response to a change in state 24 in the DUT. This transient current is represented conceptually by variable current source 25 in the DUT. An example of a change in state includes, for example, the DUT powering-up or changing its operation in some way that may support the transient current that causes the deviation in voltage at the DUT. In this example, the deviation in voltage incudes a temporary drop in the voltage followed by a temporary rise in the voltage. In another example, the deviation includes a temporary rise in the voltage followed by a temporary drop in the voltage. The voltage output of the voltage source may be controlled to reduce or to eliminate deviations in voltage at the DUT as explained above so that, in this example, the DUT receives a stabilized 3.3V.

The circuitry of FIG. 1 includes voltage sense lines 29 and 30. In some implementations, the sense lines include Kelvin connections. These voltage sense lines may be used during calibration operations to sense voltage at the DUT. For example, during calibration, a voltage sensor 32 may monitor the sense lines to determine the voltage across the DUT. The voltage sensed by the voltage sensor may be provided to the control system. The control system may use the sensed voltage, or a digitized version of this sensed voltage, to determine, for example, the timing, the shape, and/or the magnitude of the voltage deviations caused at the DUT by transient current. The control system may then adjust the voltage output of the voltage source during testing of the DUT based on, for example, the timing, the shape, and/or the magnitude of the voltage deviations in order to reduce or to eliminate the voltage deviations. The control system may also adjust the voltage output of the voltage source during testing of the DUT based on an unspecified load between the voltage source and the DUT. In other words, the feedforward control process described herein is capable of adjusting the output voltage regardless of the load between the voltage source and the DUT. Thus, the calibration may take into account any capacitive, inductive, and/or resistive load between the voltage source and the DUT, including inherent properties of conductor 28, and factor the effects of that load on the voltage to the DUT into its voltage adjustment.

The voltage sensor may be part of the voltage source as shown or separate from the voltage source. For example, the voltage sensor may include a comparator, as shown. In some implementations, the voltage sensor may be part of the control system or otherwise external to the voltage source. In some examples, the sense lines provide feedback even if the force DAC values are all known prior to testing.

In some implementation, the control system may iterate two or more times through operations that include identifying, prior to sending a test flow to the DUT, characteristics of a deviation in the voltage to appear at the DUT that results from the digital signal and the concomitant transient current in the DUT, generating a voltage based on the characteristics that is shaped to reduce the deviation, and applying that voltage to the DUT. In some implementations, the iterations may be based on information obtained during subsequent calibration operations that are not performed during testing. In some implementations, the iterations may be based on information obtained during testing that is fed back to the control system via sense lines 29 and 30. That is, in some examples, subsequent iterations take a solely feed-forward approach and in some implementations, subsequent iterations use feedback information.

Figure 3:
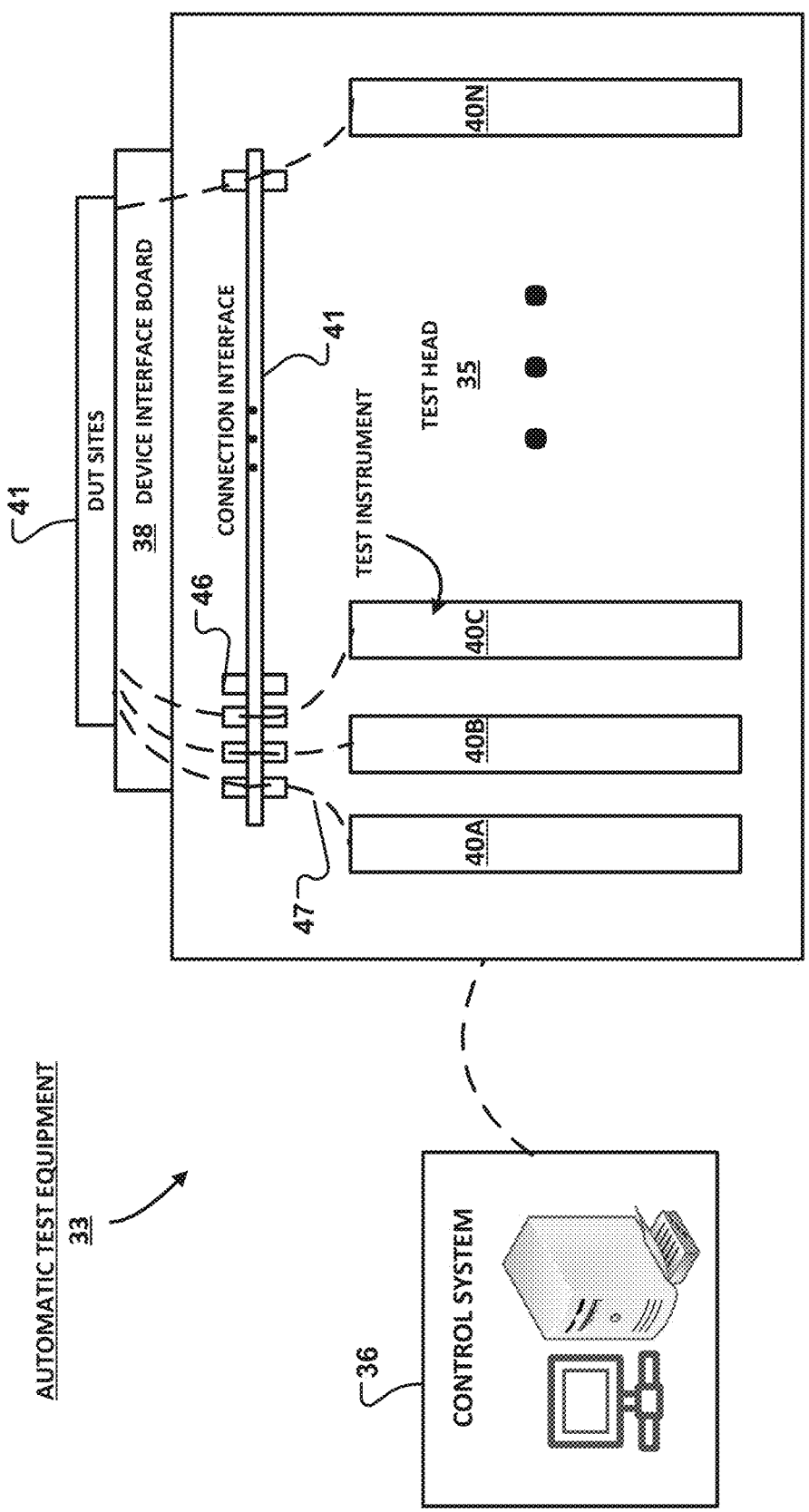
FIG. 3 is a block diagram of components of an example test system including instruments for sending digital signals to a device under test (DUT).

FIG. 3 shows components of ATE 33 that may be used to implement the DUT voltage stabilization techniques described herein. ATE 33 may be part of test system 15. In FIG. 3, the dashed lines represent, conceptually, potential signal paths between components of the system. The ATE may include voltage source 10 of FIG. 1 or voltage source 10 of FIG. 1 may be separate from the ATE as shown in FIG. 1.

ATE 10 includes a test head 35 and a control system 36, which may be the same as control system 14 of FIG. 1. The control system may include a computing system comprised of one or more microprocessors or other appropriate processing devices as described herein. DIB 38 includes a printed circuit board (PCB) that is connected to test head 11 and that includes mechanical and electrical interfaces to one or more DUTs, such as DUT 11, that are being tested or are to be tested by the ATE. Power, including voltage, may be run via one or more conduits in the DIB to DUTs connected to the DIB. Power, including voltage, may also be run through one or more passive electronic devices, such as capacitors, inductors, or resistors connected along the one or more conduits and/or on the DIB, or through one or more active electronic devices connected along the one or more conduits and/or on the DIB.

In the example of FIG. 3, DIB 38 connects, electrically and mechanically, to test head 35. The DIB includes sites 41, which may include pins, conductive traces, or other points of electrical and mechanical connection to which the DUTs may connect. Test signals, response signals, voltage signals, and other signals pass via test channels over the sites between the DUTs and test instruments. DIB 38 may also include, among other things, connectors, conductive traces and circuitry for routing signals between the test instruments, DUTs connected to sites 41, and other circuitry.

Control system 36 communicates with components of the test head and voltage source 10 (FIG. 1) to control testing. For example, control system 36 may download test program sets to test instruments 40A to 40N in the test head. The test instruments are hardware devices that may include one or more processing devices and other circuitry. Test instruments 40A to 40N may run the test program sets to test DUTs in communication with the test instruments. Control system 36 may also send, to test instruments in the test head, instructions, test data, and/or other information that are usable by the test instruments to perform appropriate tests on DUTs interfaced to the DIB. In some implementations, this information may be sent via a computer or other type of network or via a direct electrical path. In some implementations, this information may be sent via a local area network (LAN) or a wide area network (WAN).

A test program generates a test flow to provide to the DUT. The test flow is written to output digital signals to elicit a response from the DUT, for example. The test flow may also be written to output control signals to control the voltage source to apply an appropriate voltage to the DUT during testing. In some implementations, the control system may change a test program that produces the test flow based on the characteristics of the voltage signal at the DUT that are determined during pre-testing calibration operations. This may be done to reduce or to eliminate the deviation from the intended voltage at the DUT described previously. For example the changes to the test program may include adding instructions to the test program or changing existing instructions in the test program to adjust the voltage at the DUT to specified magnitudes and/or shapes at specified times in order to reduce the voltage deviation at the DUT.

In the example of FIG. 3, ATE 10 includes multiple test instruments 40A to 40N, each of which may be configured, as appropriate, to perform one or more of testing and/or other functions. Although only four test instruments are depicted, the system may include any appropriate number of test instruments, including those residing outside of test head 35. In some implementations, each test instrument may be configured to output digital signals to test a DUT based, e.g., on data provided by the control system, and to receive response signals from the DUT. Different test instruments may be configured to perform different types of tests and/or be configured to test different DUTs. The received signals may include response signals that are based on the test signals and/or signals that originate from the DUT that are not prompted by (e.g., are not in response to) test signals. In some implementations, there may be electrical conductors, such as copper wires, between the DUT, the DIB, and the test instrument interfaces over which test and response signals are sent.

Signals, including voltage from the voltage source, may be sent to, and received from, the DUT over multiple test channels or other electrically conductive media. In some examples, a test channel may include the physical transmission medium or media over which signals are sent from the test instrument to a DUT and over which signals are received from the DUT. Physical transmission media may include, but are not limited to, electrical conductors alone or in combination with optical conductors, wireless transmission media, or both optical conductors and wireless transmission media. In some examples, a test channel may include a range of frequencies over which signals are transmitted over one or more physical transmission media. A test channel may include and/or electrically connect to a conductive trace on the DIB.

In some examples, ATE 10 includes a connection interface 44 that connects test instrument test channels 47 to DIB 38. Connection interface 44 may include connectors 46 or other devices for routing signals between the test instruments and DIB 38. For example, the connection interface may include one or more circuit boards or other substrates on which such connectors are mounted. Conductors that are included in the test channels may be routed through the connection interface and the DIB.

The techniques described herein may be used during scan testing. In a scan testing system, memory elements in a device are connected to form a scan register or chain. An internal state of a device is controlled by shifting-in—or scanning-in—test data to be applied to components of the device. A logic response of those components can be obtained by shifting-out—or scanning-out—the data stored in the scan register. However, the techniques described herein are not limited to use in testing, but rather may be used in any appropriate technological context.

All or part of the test systems and processes described in this specification and their various modifications may be configured or controlled at least in part by one or more computers such as control system 36 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the voltage source, the test system, and processes described herein can be performed by one or more programmable processors executing one or more computer programs to control all or some of the well formation operations described previously. All or part of the test systems and processes can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A test system comprising:
    a voltage source to provide voltage to a device under test (DUT);
    a test instrument to send a test flow to the DUT over one or more test channels;
    one or more processing devices (i) to identify one or more characteristics of a deviation in a first voltage to appear at the DUT, the first voltage to be based on the voltage from the voltage source, the deviation to result from a digital signal and a concomitant transient current in the DUT, the digital signal to be part of the test flow, where the one or more characteristics are identified prior to sending the test flow to the DUT, and (ii) to control the voltage source to output a second voltage, the second voltage being based on the one or more characteristics and being shaped to reduce the deviation; and one or more sense lines between the voltage source and the DUT, the one or more sense lines to sense voltage proximate to the DUT;

wherein the one or more processing devices are configured to perform a calibration operation to determine the second voltage, the second voltage being based on an unspecified load between the voltage source and the DUT.

2. The test system of claim 1, wherein the transient current is caused by a change in state of the DUT caused by the digital signal.

3. test system of claim 1, wherein the deviation comprises a temporary drop in the first voltage followed by a temporary rise in the first voltage.

4. The test system of claim 1, wherein the deviation comprises a temporary rise in the first voltage followed by a temporary drop in the first voltage.

5. The test system of claim 1, wherein the deviation comprises either (i) a temporary drop in the first voltage followed by a temporary rise in the first voltage, or (ii) a temporary rise in the first voltage followed by a temporary drop in the first voltage; and wherein the one or more characteristics are based on either (i) a magnitude of the temporary drop in the first voltage and a magnitude of the temporary rise in the first voltage, or (ii) a magnitude of the temporary rise in the first voltage and a magnitude of the temporary drop in the first voltage.

6. The test system of claim 1, wherein the one or more characteristics comprises a duration between the digital signal and the deviation in the first voltage.

7. The test system of claim 1, wherein outputting the second voltage comprises changing a test program that also produces the test flow.

8. The test system of claim 1, wherein the one or more processing devices are configured to control operations comprising:

iterating two or more times through the identifying and controlling operations in order to reduce the deviation further during each iteration.

9. The test system of claim 1, wherein the test flow implements scan testing.

10. The test system of claim 1, further comprising:
a voltage sensor to sense voltage at the DUT;
wherein identifying the one or more characteristics is based on the sensed voltage.

11. The test system of claim 1, wherein the one or more processing devices are configured to perform operations comprising:
controlling the voltage source based also on the voltage proximate to the DUT.

12. A test system comprising:
a voltage source to provide voltage to a device under test (DUT);
a test instrument to send a test flow to the DUT over one or more test channels;
one or more processing devices (i) to identify one or more characteristics of a deviation in a first voltage to appear at the DUT, the first voltage to be based on the voltage from the voltage source, the deviation to result from a digital signal and a concomitant transient current in the DUT, the digital signal to be part of the test flow, where the one or more characteristics are identified prior to sending the test flow to the DUT, and (ii) to control the voltage source to output a second voltage, the second voltage being based on the one or more characteristics and being shaped to reduce the deviation; and
a device interface board (DIB) for connecting the test instrument to the DUT, the DIB comprising a site to which the DUT connects;
wherein the one or more characteristics of the deviation are based on at least one of inductance or capacitance on one or more conductors or components contained in the DIB.

13. The test system of claim 12, wherein the transient current is caused by a change in state of the DUT caused by the digital signal.

14. The test system of claim 12, wherein the deviation comprises a temporary drop in the first voltage followed by a temporary rise in the first voltage.

15. The test system of claim 12, wherein the deviation comprises a temporary rise in the first voltage followed by a temporary drop in the first voltage.

16. The test system of claim 12, wherein the deviation comprises either (i) a temporary drop in the first voltage followed by a temporary rise in the first voltage, or (ii) a temporary rise in the first voltage followed by a temporary drop in the first voltage; and wherein the one or more characteristics are based on either (i) a magnitude of the temporary drop in the first voltage and a magnitude of the temporary rise in the first voltage, or (ii) a magnitude of the temporary rise in the first voltage and a magnitude of the temporary drop in the first voltage.

17. The test system of claim 12, wherein the one or more characteristics comprises a duration between the digital signal and the deviation in the first voltage.

18. The test system of claim 12, wherein the voltage source is controlled by a test program that also produces the test flow.

19. The test system of claim 12, wherein the one or more processing devices are configured to control operations comprising:

iterating two or more times through the identifying and controlling operations in order to reduce the deviation further during each iteration.

20. The test system of claim 12, wherein the test flow implements scan testing.

21. The test system of claim 12, further comprising:
a voltage sensor to sense voltage at the DUT;
wherein identifying the one or more characteristics is based on the sensed voltage.

22. The test system of claim 21 wherein the voltage sensor is part of the voltage source.

23. The test system of claim 21, wherein the voltage sensor is separate from the voltage source.

* * * * *